US012795861B2

(12) United States Patent
Chien et al.

(10) Patent No.: US 12,795,861 B2
(45) Date of Patent: Nov. 10, 2026

(54) TWO-IN-ONE AIR SHROUD DESIGN

(71) Applicant: DELL PRODUCTS L.P., Round Rock, TX (US)

(72) Inventors: Hung-Pin Chien, New Taipei City (TW); Yu-Hung Wang, Tainan (TW); Yi-Yun Chang, New Taipei City (TW)

(73) Assignee: Dell Products L.P., Round Rock, TX (US)

( * ) Notice: Subject to any disclaimer, the term of this patent is extended or adjusted under 35 U.S.C. 154(b) by 245 days.

(21) Appl. No.: 18/427,655

(22) Filed: Jan. 30, 2024

(65) Prior Publication Data

US 2025/0248004 A1 Jul. 31, 2025

(51) Int. Cl.
*H05K 7/20* (2006.01)
*G06F 1/20* (2006.01)

(52) U.S. Cl.
CPC ........... *H05K 7/20727* (2013.01); *G06F 1/20* (2013.01)

(58) Field of Classification Search
CPC ...... H05K 7/1427; H05K 5/0217; H05K 5/03; H05K 7/20727; H05K 7/20718; H05K 7/20709; H05K 5/069; H05K 5/13; H05K 7/20436; H05K 13/00; G06F 1/1656; G06F 1/20
See application file for complete search history.

(56) References Cited

U.S. PATENT DOCUMENTS

| | | | | |
|---|---|---|---|---|
| 5,490,036 | A * | 2/1996 | Lin | G06F 1/1616 361/679.55 |
| 5,597,035 | A | 1/1997 | Smith et al. | |
| 5,963,424 | A * | 10/1999 | Hileman | G06F 1/206 361/679.48 |
| 6,061,237 | A * | 5/2000 | Sands | H05K 7/20172 361/679.48 |
| 6,288,898 | B1 * | 9/2001 | Johnson | G06F 1/20 165/185 |
| 6,822,863 | B1 * | 11/2004 | Artman | G06F 1/20 165/122 |
| 11,071,229 | B1 * | 7/2021 | Chu | H05K 7/20145 |
| 2003/0169567 | A1 * | 9/2003 | Tantoush | G06F 1/20 361/695 |
| 2013/0148290 | A1 * | 6/2013 | Chen | G06F 1/20 454/322 |
| 2019/0018458 | A1 * | 1/2019 | Turchin | G06F 1/1641 |
| 2019/0239393 | A1 * | 8/2019 | Liang | H05K 7/20145 |
| 2021/0103314 | A1 * | 4/2021 | Ko | G06F 1/1681 |
| 2021/0247730 | A1 * | 8/2021 | Tunks | H05K 7/20145 |
| 2022/0022342 | A1 * | 1/2022 | He | G06F 1/20 |
| 2022/0326744 | A1 * | 10/2022 | Pan | H05K 7/20727 |

* cited by examiner

*Primary Examiner* — Adam B Dravininkas
(74) *Attorney, Agent, or Firm* — Larson Newman, LLP

(57) ABSTRACT

An air shroud is provided to direct air flow in an information handling system. The air shroud includes a first portion, a second portion, and an adjustable portion. The first portion directs the air flow through dual-inline memory modules of the information handling system. The second portion directs the air flow through a processor stack of the information handling system. The adjustable portion is coupled between the first portion and the second portion, and is configured to be adjusted to a first length when the information handling system is in a 1U enclosure, and to be adjusted to a second length when the information handling system is in a 2U enclosure.

19 Claims, 4 Drawing Sheets

TWO-IN-ONE AIR SHROUD DESIGN

FIELD OF THE DISCLOSURE

This disclosure generally relates to information handling systems, and more particularly relates to air shrouds in information handling systems.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An air shroud may be provided to direct air flow in an information handling system. The air shroud may include a first portion, a second portion, and an adjustable portion. The first portion may direct the air flow through dual-inline memory modules (DIMMs) of the information handling system. The second portion may direct the air flow through a processor stack of the information handling system. The adjustable portion may be coupled between the first portion and the second portion, and may be configured to be adjusted to a first length when the information handling system is in a 1U enclosure, and to be adjusted to a second length when the information handling system is in a 2U enclosure.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources. Moreover, unless otherwise indicated in the following discussion, the Figures are illustrative, and are not intended to accurately represent the actual size or scale of the items discussed.

Figure 1A:
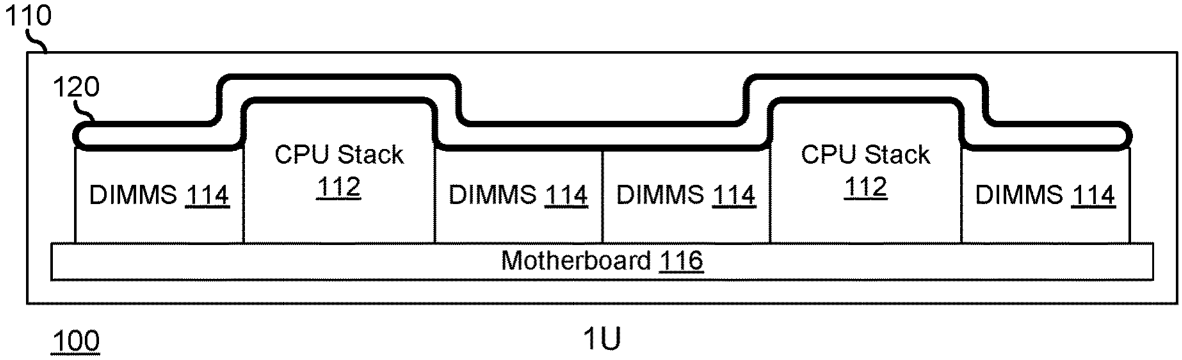
FIG. 1A (Prior Art)
FIG. 1A is a sectional view of an information handling system as is known in the prior art.

FIG. 1A shows an information handling system 100 as may be known in the art. Information handling system 100 represents a 1U server system in accordance with the Electronic Industries Alliance (EIA) standard for Cabinets, Racks, Panels and Associated Equipment (EIA-310-E) or other applicable standards for defining equipment enclosures and dimensions, as needed or desired. Information handling system 100 includes a 1U enclosure 110. Enclosure 110 includes one or more CPU stack 112, and one or more banks of dual in-line memory modules (DIMMs) 114 mounted and electrically connected to a motherboard 116, and an air shroud 120.

CPU stack 112 may be understood to include a CPU device mounted to motherboard 116, and a heatsink assembly mounted atop the CPU device. CPU stack 112 typically represents elements within enclosure 110 that, along with motherboard 116 and associated stand offs to mount the motherboard to the enclosure, rise to a height that most nearly occupies the entire height of the enclosure. In this regard, CPU stack 112 may be understood to occupy a greater height than the height of associated banks of DIMMs 114. For example, a typical 1U server may have an enclosure height of 44.5 mm (1.75 in), the top side of the motherboard may typically be 8 mm from the bottom of the enclosure, and the DIMMs have a height of 30 mm, and so the top of the DIMMs may be understood to be 38 mm high, leaving a gap of 6.5 mm above the DIMMs. On the other hand, the CPU may have a height of 8 mm, and the heatsink may have a height in 1U servers of 24.5 mm, and so the top of the CPU stack may have a height of 41 mm, leaving a gap of 3.5 mm above the CPU.

Air shroud 120 may be placed less than 1 mm above CPU stack 112 and above DIMMs 114, with the portion of the air shroud that is above the CPU stack elevated around 3 mm above the portion of the air shroud that is above the DIMMs.

Air shroud 120 is provided to direct the airflow within information handling system 100. In particular, air shroud 120 operates to ensure that an airflow within information handling system 100 that is directed at CPU stacks 112 and DIMMs 114 continues to flow through the CPU stacks and the DIMMs, without being diverted upward and away from the CPU stacks and the DIMMs. Air shroud 120 may be affixed to mounting structures on enclosure 110, or via standoffs to mainboard 116, as needed or desired.

Figure 1B:
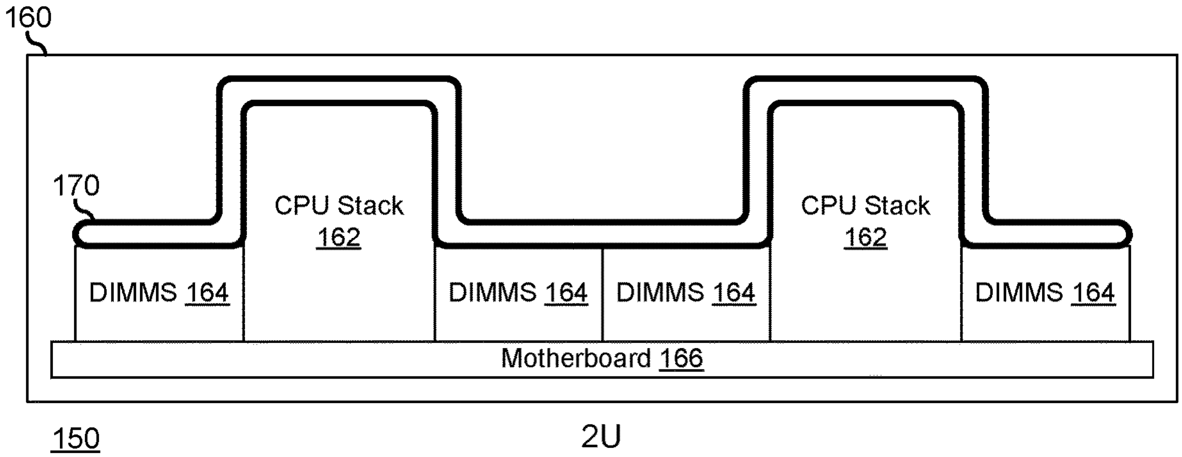
FIG. 1B (Prior Art)
FIG. 1B is a sectional view of another information handling system as is known in the prior art.

FIG. 1B shows an information handling system 150 as may be known in the art. Information handling system 150 represents a 2U server system in accordance with the EIA-310-E or other applicable standards, as needed or desired. Information handling system 150 includes a 2U enclosure 160. Enclosure 160 includes one or more CPU stack 162, and one or more banks of DIMMs 164 mounted and electrically connected to a motherboard 166, and an air shroud 170. CPU stack 162 is similar to CPU stack 112, and may be understood to include a CPU device mounted to motherboard 166, and a heatsink assembly mounted atop the CPU device, and the CPU stack may further be understood to occupy a greater height than the height of associated banks of DIMMs 164. As such, air shroud 170 may be placed less than 1 mm above CPU stack 162 and above DIMMs 164, with the portion of the air shroud that is above the CPU stack elevated around 42 mm above the portion of the air shroud that is above the DIMMs. Air shroud 170 is similar to air shroud 120 as described above, directing the airflow in information handling system 150 through CPU stacks 162 and DIMMs 164. Air shroud 170 may be affixed to mounting structures on enclosure 160, or via standoffs to mainboard 166, as needed or desired.

Thus air shroud 120 may have a height of around 4 mm, while air shroud 170 may have a height of around 43 mm. In either case, air shrouds 120 and 170 may typically have a length within an airflow in respective enclosures 110 and 160 of around 134 mm to cover respective DIMMs 114 and 164. This length will be understood to be sufficient to fully shroud respective CPU stacks 112 and 162. However, a manufacturer of 1U and 2U servers will need to maintain an inventory of two different air shrouds; a first inventory item similar to air shroud 120 for 1U servers, and a second inventory item similar to air shroud 170 for 2U servers.

Figure 2A:
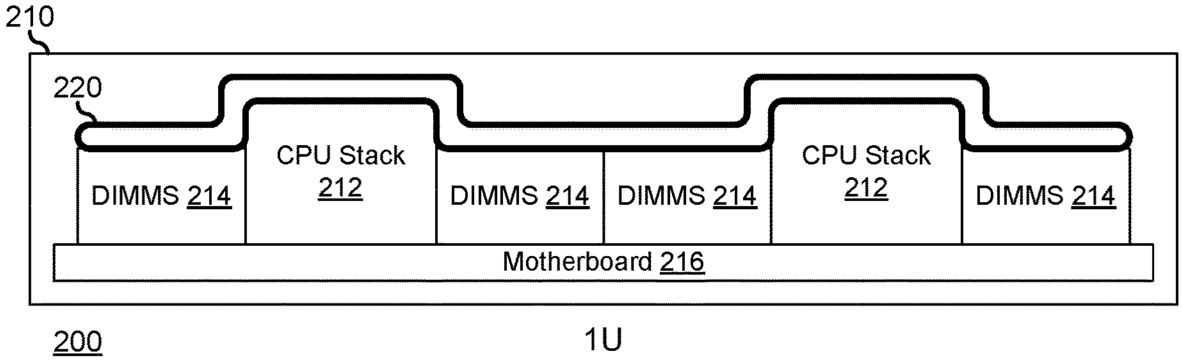
FIG. 2A is a sectional view of an information handling system according to an embodiment of the current disclosure.

FIG. 2A illustrates a sectional view of an information handling system 200 according to an embodiment of the current disclosure. Information handling system 200 represents a 1U server system in accordance with the EIA-310-E or other applicable standards for defining equipment enclosures and dimensions, as needed or desired. Information handling system 200 includes a 1U enclosure 210. Enclosure 210 includes one or more CPU stack 212, and one or more banks of DIMMs 214 mounted and electrically connected to a motherboard 216, and an air shroud 220. CPU stack 212 is similar to CPU stack 112, and may be understood to include a CPU device mounted to motherboard 216, and a heatsink assembly mounted atop the CPU device, and the CPU stack may further be understood to occupy a greater height than the height of associated banks of DIMMs 214. As such, air shroud 220 may be placed less than 1 mm above CPU stack 212 and above DIMMs 214, with the portion of the air shroud that is above the CPU stack elevated around 3 mm above the portion of the air shroud that is above the DIMMs. Air shroud 220 is similar to air shrouds 120 and 170 as described above, directing the airflow in information handling system 200 through CPU stacks 662 and DIMMs 264. Air shroud 220 may be affixed to mounting structures on enclosure 210, or via standoffs to mainboard 216, as needed or desired.

Figure 2B:
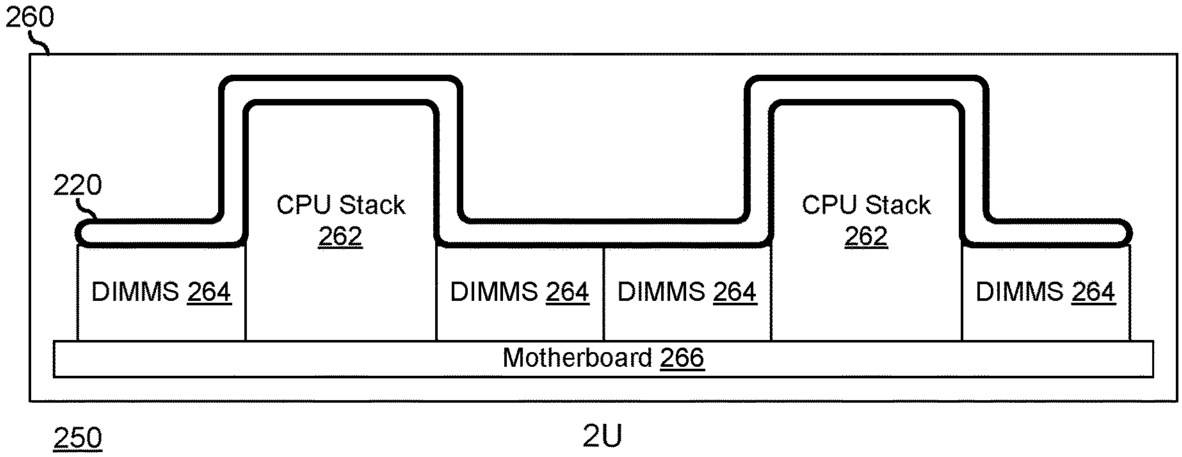
FIG. 2B is a sectional view of another information handling system according to an embodiment of the current disclosure.

FIG. 2B shows an information handling system 250 as may be known in the art. Information handling system 250 represents a 2U server system in accordance with the EIA-310-E or other applicable standards, as needed or desired. Information handling system 250 includes a 2U enclosure 260. Enclosure 260 includes one or more CPU stack 262, and one or more banks of DIMMs 264 mounted and electrically connected to a motherboard 266, and a common air shroud 220. CPU stack 262 is similar to CPU stack 212, and may be understood to include a CPU device mounted to motherboard 266, and a heatsink assembly mounted atop the CPU device, and the CPU stack may further be understood to occupy a greater height than the height of associated banks of DIMMs 264. As such, air shroud 220 may be placed less than 1 mm above CPU stack 262 and above DIMMs 264, with the portion of the air shroud that is above the CPU stack elevated around 42 mm above the portion of the air shroud that is above the DIMMs. Air shroud 220 is similar to air shrouds 120, 170, and 220, as described above, directing the airflow in information handling system 250 through CPU stacks 262 and DIMMs 264. Air shroud 170 may be affixed to mounting structures on enclosure 260, or via standoffs to mainboard 266, as needed or desired. Air shroud 220 is adaptable to provide a single inventory item for 1U servers and 2U servers. Thus for example air shroud 220 may have a height of around 4 mm when utilized in 1U servers, while the air shroud may have a height of around 43 mm when utilized in 2U servers. Note that DIMM heights for future generations of DIMMs may not remain the same as current DIMM generations. However, the use of air shroud 220 would be understood to be adaptable for the varying DIMM heights as may be utilized in future generations of DIMMs, as needed or desired.

Figure 3A:
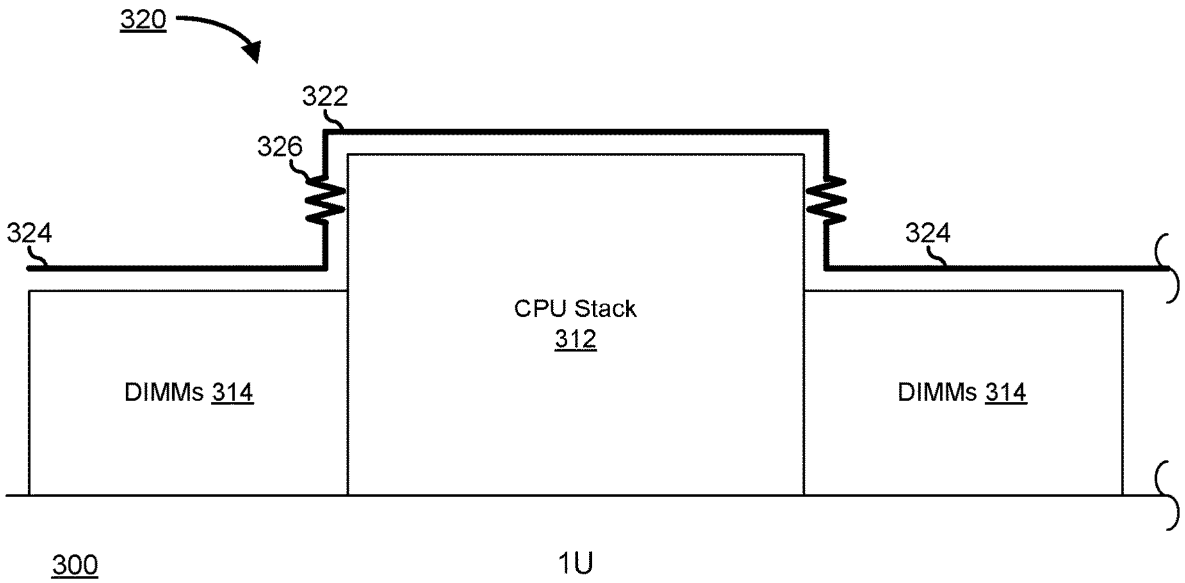
FIG. 3A is a sectional view of an information handling system similar to the information handling system of FIG. 2A.
Figure 3B:
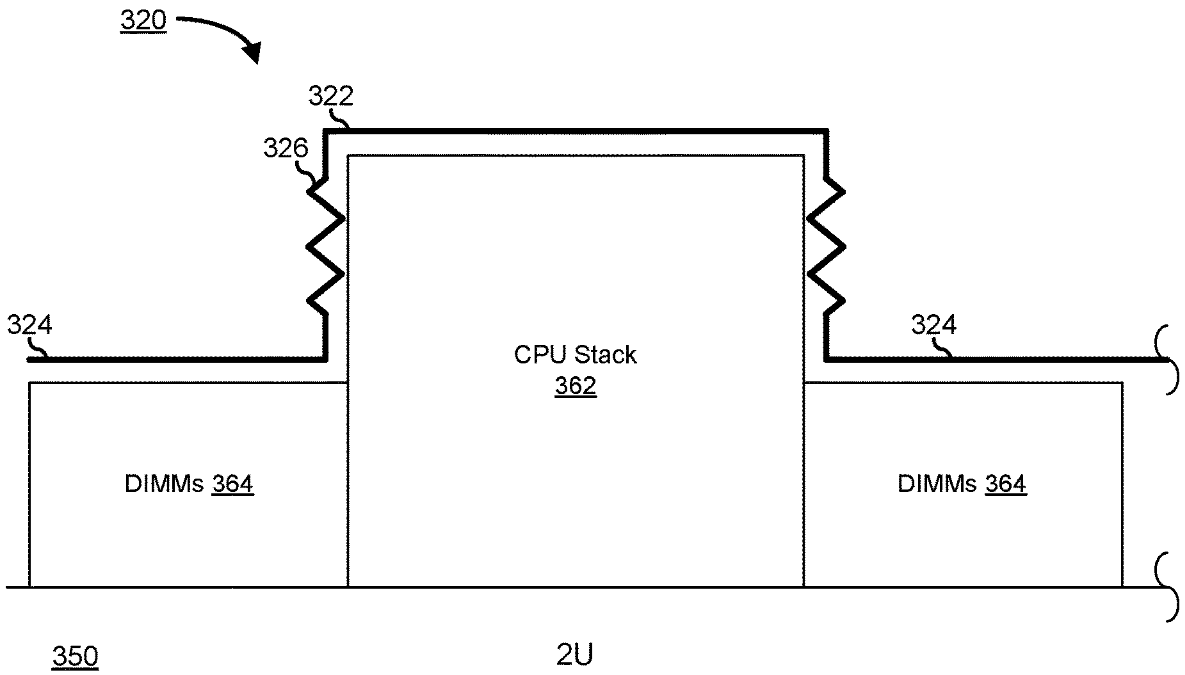
FIG. 3B is a sectional view of an information handling system similar to the information handling system of FIG. 2B.

FIGS. 3A and 3B illustrate a portion of an embodiment of an air shroud 320 that is similar to air shroud 220 and is adaptable for use in both 1U and 2U servers, as described above with respect to FIGS. 2A and 2B. FIG. 3A illustrates an information handling system 300, represented as a 1U server, and including a CPU stack 312, associated DIMMs 314, and a portion of air shroud 320. FIG. 3B illustrates an information handling system 350, represented as a 1U server, and including a CPU stack 352, associated DIMMs 354, and a portion of air shroud 320. In representing a portion of air shroud 320, it will be understood that the features of the air shroud, as described herein, may be applied to the portion of the air shroud that covers one or more additional CPU stack similar to CPU stack 312.

Air shroud 320 includes a CPU stack covering portion 322, DIMM covering portions 324, and adjustable side portions 326. CPU stack covering portion 322 is configured to be placed less than 1 mm above CPU stack 312 when used in a 1U server, and less than 1 mm above CPU stack 362 when used in a 2U server. Similarly, DIMM covering portion 322 is configured to be placed less than 1 mm above DIMMs 364 when used in a 1U server, and less than 1 mm above DIMMs 364 when used in a 2U server. Adjustable side portions 326 are configured to be collapsed to a short dimension to cover the portion of CPU stack 312 extending above DIMMs 314 in 1U servers, and to be expanded to a long dimension to cover the portion of CPU stack 362 extending above DIMMs 364 in 2U servers. Adjustable side portions 326 are illustrated as including three (3) folds that are collapsed in the 1U configuration and that are expanded in the 2U configuration.

However, a different number of folds may be utilized as needed or desired. For example, adjustable side portions 326 may include one (1) fold, where each section of the fold has a length that is one half (½) of the difference between the short length and the long length. Thus, where air shroud 320 has a height of around 4 mm when utilized in 1U servers, and a height of around 43 mm when utilized in 2U servers, and where adjustable side portions 326 include a single (1) fold, then each section of the fold will be 19.5 mm long (that is, (43 mm−4 mm)/2). In another example, adjustable side portions 326 may include a larger number of folds, such as where the adjustable side portions are fabricated by a tightly corrugated set of folds that are expandable to adjust from the short length to the long length.

In a particular embodiment, air shroud 320 is fabricated of a single material, such as a plastic material, a metal material, a rubber-like material, a fiberglass material, or a combination thereof. For example, air shroud 320 may be fabricated of a semi-rigid plastic material that is deformable from the short dimension to the long dimension as needed to adapt from the form adaptable to 1U servers to the form adaptable to 2U servers. In a particular case, the deformable plastic material may maintain its shape in either the 1U configuration or the 2U configuration. That is, an air shroud that was most recently used in the 1U configuration remains in the 1U configuration until reformed to the 2U configuration, and vice versa. In another case, the deformable plastic material has a preferred memory configuration, such as the 1U configuration. When the air shroud is removed from a 2U server, the air shroud returns to the 1U configuration, for example, due to an elastic property of the deformable plastic material. In another embodiment, air shroud 320 is fabricated of a combination of a hard plastic material in CPU stack covering portion 322, DIMM covering portions 324, and a simi-rigid plastic material in adjustable side portions 326. Air shroud 320 may be fabricated utilizing, for example, a double-injection molding process, or the like. The suitability and use of materials to make an air shroud with sufficient durability, strength, flexibility, and the like, are known in the art and will not be further described herein, except as may be needed to illustrate the current embodiments.

In a particular embodiment, an air shroud similar to air shroud 220 may be fabricated of multiple interacting parts. For example, one or more CPU covering portions of the air shroud may be telescoped into associated intermediate portions and the associated DIMM covering portions. In the 1U configuration, the telescoping parts are collapsed to provide the short dimension for the adjustable side portions. Further, in the 2U configuration, the telescoping parts are expanded to provide the long dimension for the adjustable side portions.

Figure 4:
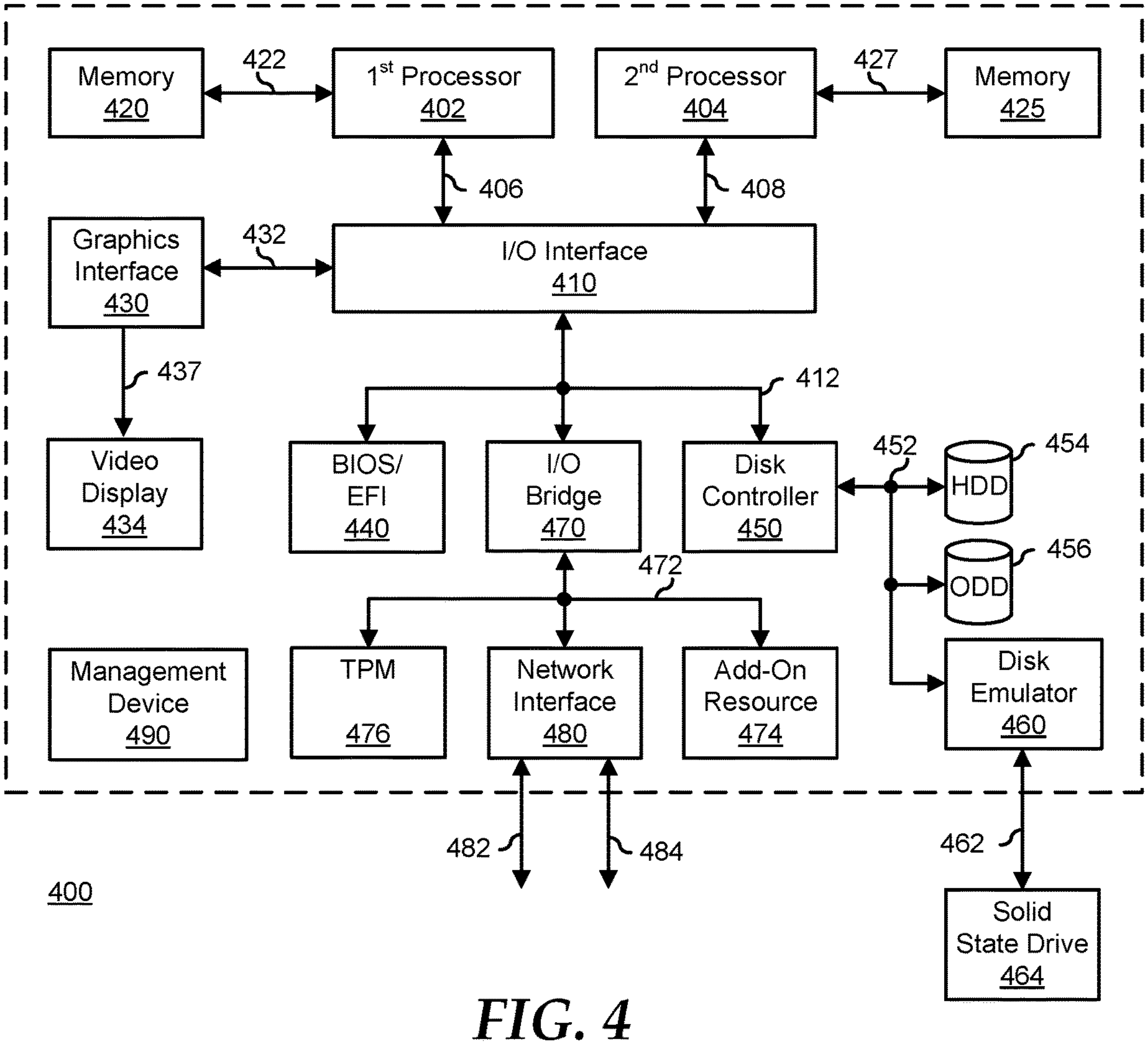
FIG. 4 is a block diagram illustrating a generalized information handling system according to another embodiment of the present disclosure.

FIG. 4 illustrates a generalized embodiment of an information handling system 400. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described below, and operates to perform one or more of the methods described below. Information handling system 400 includes a processors 402 and 404, an input/output (I/O) interface 410, memories 420 and 425, a graphics interface 430, a basic input and output system/universal extensible firmware interface (BIOS/UEFI) module 440, a disk controller 450, a hard disk drive (HDD) 454, an optical disk drive (ODD) 456, a disk emulator 460 connected to an external solid state drive (SSD) 462, an I/O bridge 470, one or more add-on resources 474, a trusted platform module (TPM) 476, a network interface 480, a management device 490, and a power supply 495. Processors 402 and 404, I/O interface 410, memory 420, graphics interface 430, BIOS/UEFI module 440, disk controller 450, HDD 454, ODD 456, disk emulator 460, SSD 462, I/O bridge 470, add-on resources 474, TPM 476, and network interface 480 operate together to provide a host environment of information handling system 400 that operates to provide the data processing functionality of the information handling system. The host environment operates to execute machine-executable code, including platform BIOS/UEFI code, device firmware, operating system code, applications, programs, and the like, to perform the data processing tasks associated with information handling system 400.

In the host environment, processor 402 is connected to I/O interface 410 via processor interface 406, and processor 404 is connected to the I/O interface via processor interface 408. Memory 420 is connected to processor 402 via a memory interface 422. Memory 425 is connected to processor 404 via a memory interface 427. Graphics interface 430 is connected to I/O interface 410 via a graphics interface 432, and provides a video display output 436 to a video display 434. In a particular embodiment, information handling system 400 includes separate memories that are dedicated to each of processors 402 and 404 via separate memory interfaces. An example of memories 420 and 430 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 440, disk controller 450, and I/O bridge 470 are connected to I/O interface 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 410 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 440 includes BIOS/UEFI code operable to detect resources within information handling system 400, to provide drivers for the resources, initialize the resources, and access the resources. BIOS/UEFI module 440 includes code that operates to detect resources within information handling system 400, to provide drivers for the resources, to initialize the resources, and to access the resources.

Disk controller 450 includes a disk interface 452 that connects the disk controller to HDD 454, to ODD 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits SSD 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O bridge 470 includes a peripheral interface 472 that connects the I/O bridge to add-on resource 474, to TPM 476, and to network interface 480. Peripheral interface 472 can be the same type of interface as I/O channel 412, or can be a different type of interface. As such, I/O bridge 470 extends the capacity of I/O channel 412 where peripheral interface 472 and the I/O channel are of the same type, and the I/O bridge translates information from a format suitable to the I/O channel to a format suitable to the peripheral channel 472 where they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as I/O interface 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management device 490 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 400. In particular, management device 490 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 400, such as system cooling fans and power supplies. Management device 490 can include a network connection to an external management system, and the management device can communicate with the management system to report status information for information handling system 400, to receive BIOS/UEFI or system firmware updates, or to perform other task for managing and controlling the operation of information handling system 400. Management device 490 can operate off of a separate power plane from the components of the host environment so that the management device receives power to manage information handling system 400 where the information handling system is otherwise shut down. An example of management device 490 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 490 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An air shroud to direct air flow in an information handling system, the air shroud comprising:

a first portion configured to direct the air flow through dual-inline memory modules of the information handling system;

a second portion configured to direct the air flow through a processor stack of the information handling system; and an adjustable portion coupled between the first portion and the second portion, wherein the adjustable portion is configured to be adjusted to a first length when the information handling system is in a 1U enclosure, and to be adjusted to a second length when the information handling system is in a 2U enclosure;

wherein the air shroud is fabricated in a dual injection molding process.

2. The air shroud of claim 1, wherein the first portion and the second portion are fabricated of a first plastic material.

3. The air shroud of claim 2, wherein the adjustable portion is fabricated of a deformable plastic material.

4. The air shroud of claim 3, wherein the deformable plastic material is the first plastic material.

5. The air shroud of claim 3, wherein the deformable plastic material is a second plastic material.

6. The air shroud of claim 2, wherein the adjustable portion is fabricated of a folded metal material.

7. The air shroud of claim 1, wherein, at a first time, the adjustable portion is adjusted to the first length for installation in the 1U server.

8. The air shroud of claim 7, wherein, after a second time when the adjustable portion is adjusted to the second length for installation in the 2U server, at a third time when the air shroud is removed from the 2U server, the adjustable portion retains the second length.

9. The air shroud of claim 7, wherein, after a second time when the adjustable portion is adjusted to the second length for installation in the 2U server, at a third time when the air shroud is removed from the 2U server, the adjustable portion elastically returns to the first length.

10. An method for directing air flow in an information handling system, the method comprising:

providing a first portion of an air shroud, the first portion configured to direct the air flow through dual-inline memory modules of the information handling system;

providing a second portion of the air shroud, the second portion configured to direct the air flow through a processor stack of the information handling system; and providing an adjustable portion of the air shroud coupled between the first portion and the second portion, wherein the adjustable portion is configured to be adjusted to a first length when the information handling system is in a 1U enclosure, and to be adjusted to a second length when the information handling system is in a 2U enclosure;

wherein the air shroud is fabricated in a dual injection molding process.

11. The method of claim 10, wherein the first portion and the second portion are fabricated of a first plastic material.

12. The method of claim 11, wherein the adjustable portion is fabricated of a deformable plastic material.

13. The method of claim 12, wherein the deformable plastic material is the first plastic material.

14. The method of claim 12, wherein the deformable plastic material is a second plastic material.

15. The method of claim 11, wherein the adjustable portion is fabricated of a folded metal material.

16. The method of claim 10, further comprising adjusting, at a first time, the adjustable portion to the first length for installation in the 1U server.

17. The method of claim 16 wherein, after a second time when the adjustable portion is adjusted to the second length for installation in the 2U server, at a third time when the air shroud is removed from the 2U server, the adjustable portion retains the second length.

18. The method of claim 16 wherein, after a second time when the adjustable portion is adjusted to the second length for installation in the 2U server, at a third time when the air shroud is removed from the 2U server, the adjustable portion elastically returns to the first length.

19. An information handling system, comprising:

a plurality of dual-inline memory modules (DIMMs);

a processor stack; and an air shroud to direct air flow in the information handling system, the air shroud including:

a first portion configured to direct the air flow through the DIMMs;

a second portion configured to direct the air flow through the processor stack; and an adjustable portion coupled between the first portion and the second portion, wherein the adjustable portion is configured to be adjusted to a first length when the information handling system is in a 1U enclosure, and to be adjusted to a second length when the information handling system is in a 2U enclosure;

wherein the air shroud is fabricated in a dual injection molding process.

* * * * *